United States Patent [19]
Eriksson et al.

[11] Patent Number: 5,903,158
[45] Date of Patent: May 11, 1999

[54] MONITORING OF INTERNAL PARTIAL DISCHARGES IN A POWER TRANSFORMER

[75] Inventors: Thomas Eriksson, Uppsala; Mats Leijon, Västerås, both of Sweden

[73] Assignee: ABB Research, Ltd., Zurich, Switzerland

[21] Appl. No.: 08/750,592

[22] PCT Filed: Apr. 29, 1996

[86] PCT No.: PCT/SE96/00558

§ 371 Date: Dec. 6, 1996

§ 102(e) Date: Dec. 6, 1996

[87] PCT Pub. No.: WO96/35128

PCT Pub. Date: Nov. 7, 1996

[30] Foreign Application Priority Data

May 2, 1995 [SE] Sweden .................................. 9501664

[51] Int. Cl.$^6$ ............................................. G01R 27/26
[52] U.S. Cl. ............................................................ 324/536
[58] Field of Search ................................... 324/142, 547, 324/536, 72; 174/143

[56] References Cited

U.S. PATENT DOCUMENTS

| | | | |
|---|---|---|---|
| 3,430,136 | 2/1969 | Brustle | 324/536 |
| 3,488,591 | 1/1970 | Sonnenberg | 324/117 |
| 4,810,954 | 3/1989 | Fam | 324/142 |
| 4,897,607 | 1/1990 | Grunewald et al. | |
| 5,107,447 | 4/1992 | Ozawa | 324/536 |
| 5,185,685 | 2/1993 | Tennies | 324/536 |

OTHER PUBLICATIONS

IEC Publication 270: Partial Discharge Measurements, 1981, 2nd Edition.

Bengtsson, Status and Trends in Transformer Monitoring, Invited paper SPT IS 05–3, presented at the IEEE/KTH, Stockholm Power Tech Conference, Stockholm, Sweden, Jun. 18–22, 1995, pp. 118–123.

Kuffel et al., High–Voltage Engineering, Non–Destructive Insulation Test Techniques, 1984, pp. 432–462.

Borsi et al., Fifth International Symposium On High Voltage Engineering, Application of Rogowski Coils For Partial Discharge (PD), Decoupling And Noise Suppression, Aug. 24–28, 1987, pp. 1–4.

Fruth et al., Partial Discharge Signal Generation Transmission and Acquisition, IEE, Proc–Sci. Meas. Technol., vol. 142, No. 1, Jan. 1995, pp. 22–28.

Borsi et al., Separation Of Partial Discharges From Pulse–Shaped Noise Signals With The Help of Neural Networks IEE Proc.–Sci. Meas. Technol., vol. 142, No. 1, Jan. 1995, pp. 69–74.

James et al., Application Of A Capacitive Network Winding Representation To The Location Of Partial Discharges In Transformers, Electrical Engineering Transactions, 1977, vol. EE–13, No. 2, pp. 95–103.

*Primary Examiner*—Maura K. Regan
*Attorney, Agent, or Firm*—Pollock, Vande Sande & Amernick

[57] ABSTRACT

In a method for monitoring of partial discharges in an electric power transformer (1) under normal operating conditions, the magnetic field at a high-voltage bushing (2) on the power transformer is sensed with an inductive sensor (6) comprising at least one coil (6a, 6b) arranged at the bushing, and the electric field at the bushing is sensed with a capacitive sensor (5). The output signals from said sensors are supplied to a signal processing unit (3) in which each one of the output signals is filtered in a separate bandpass filter (101, 102), whereupon the filtered output signals from said sensors are multiplied by each other. An output signal (PDI) from the signal processing unit is formed in dependence on the result of said multiplication for the purpose of detecting internal partial discharges in the transformer.

7 Claims, 5 Drawing Sheets

5,903,158

MONITORING OF INTERNAL PARTIAL DISCHARGES IN A POWER TRANSFORMER

FIELD OF THE INVENTION

The present invention relates to a method for monitoring of partial discharges in an electric power transformer under normal operating conditions, and to a device for carrying out the method.

The device comprises a direction-sensitive two-sensor system for sensing both the electric and the magnetic field generated by a discharge.

BACKGROUND OF THE INVENTION

Voids or other defects in an insulation material may give rise to non-homogeneous electric fields in the material. In that connection, the field strength may become so high that a local discharge, a partial discharge, in the material occurs. A general description of these phenomena is given, for example, in E. Kuffel, W. S. Zaengl: High Voltage Engineering, Pergamon Press, 1984.

Conventionally, partial discharges are measured using a capacitive decoupling from the object to be measured and a detector unit, for example a bridge or a fast digital converter and a computer. In IEC Publication 270: "Partial Discharge Measurements", 1981, 2nd edition, normalized methods for such measurements and for calibration of the measurement equipment are discussed.

Measurement of partial discharges using inductive sensors based on Rogowski coils is described in Proceedings of the 1987 International Symposium on High Voltage Engineering, vol. 2, paper No. 42.02, H. Borsi, M. Hartje: "Application of Rogowski coils for Partial Discharge (PD), decoupling and noise suppression".

The occurrence of partial discharges in a high-voltage apparatus is often an indication that a fault is developing.

A power transformer is usually a critical component in a power network. An extensive fault in the transformer may cause long interruptions and expensive repairs. It is therefore desirable to discover states which may lead to faults as early as possible. A power transformer is often equipped with a capacitive test tap at its high-voltage bushings, which may be utilized as a capacitive decoupler. It is therefore also possible to carry out a conventional measurement of partial discharges under normal operating conditions.

A problem that arises during a measurement in a transformer station compared with a measurement in a test chamber environment are the disturbances that are generated by surrounding apparatus and connections. To cope with these external disturbances, different solutions have been proposed and tried, for example PRPDA and pattern recognition using neural networks. See, for example, descriptions in IEE Proc.-Science Measurement and Technology, vol. 142, No. 1, January 1995, pp. 22–28, B. A. Fruth, D. W. Gross: "Partial discharge signal generation transmission and acquisition", and in IEE Proc.-Science Measurement and Technology, vol. 142, No. 1, January 1995, pp. 69–74, H. Borsi, E. Gockenbach, D. Wenzel: "Separation of partial discharges from pulse-shaped noise signals with the help of neural networks". Both methods described in these publications are based on learning typical signal patterns. In an analysis according to the PRPDA method, data is collected over a certain period of time, whereupon the pattern for these data is compared with patterns for known types of discharges. Neural networks are taught to recognize the wave shape for certain specific types of discharges. For both of these methods, the decoupling of the partial discharges is carried out in a conventional manner.

SUMMARY OF THE INVENTION

The object of the invention is to provide an improved method of the kind described above, which makes possible a separation of internal partial discharges in the transformer from external disturbances and which may be used on both existing and new transformers, and a device for carrying out the method.

What characterizes a method and a device according to the invention will become clear from the appended claims.

The device of the present invention will be inexpensive, reliable, and simple to apply to both existing and new transformers. The present invention may also be used together with more advanced acquisition systems, such as PRPDA. The present invention will improve the performance of devices or systems utilized with it.

BRIEF DESCRIPTION OF THE DRAWINGS

The invention will be explained in more detail by description of embodiments with reference to the accompanying drawings, wherein FIG. 1 schematically shows part of a power transformer with a high-voltage bushing and a device according to the present invention.

DESCRIPTION OF THE PREFERRED EMBODIMENTS

The following description relates both to the method and device of the present invention.

Figure 1:
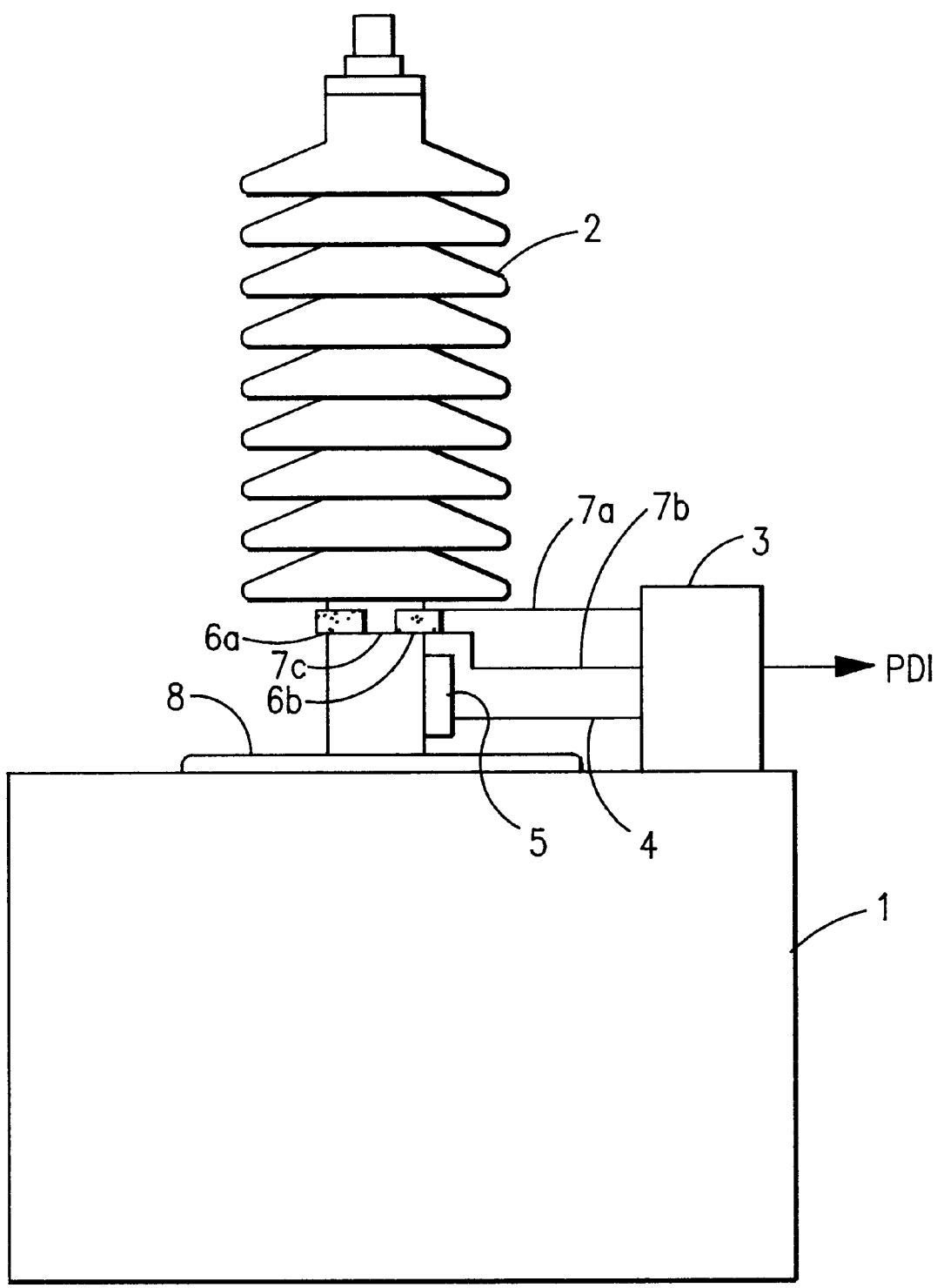

FIG. 1 shows part of an electric power transformer 1 with a high-voltage bushing 2. A signal matching unit 3 is located on the transformer close to the high-voltage bushing and is connected, by means of a conductor 4, to a capacitive test tap 5. An inductive sensor 6, which will be described in greater detail below and which comprises two coils 6a, 6b, is also connected by means of conductors 7a, 7b to the signal matching unit. The sensor is arranged at the lower part of the high-voltage bushing immediately above a flange 8, through which the bushing passes into the transformer.

Figure 9A:
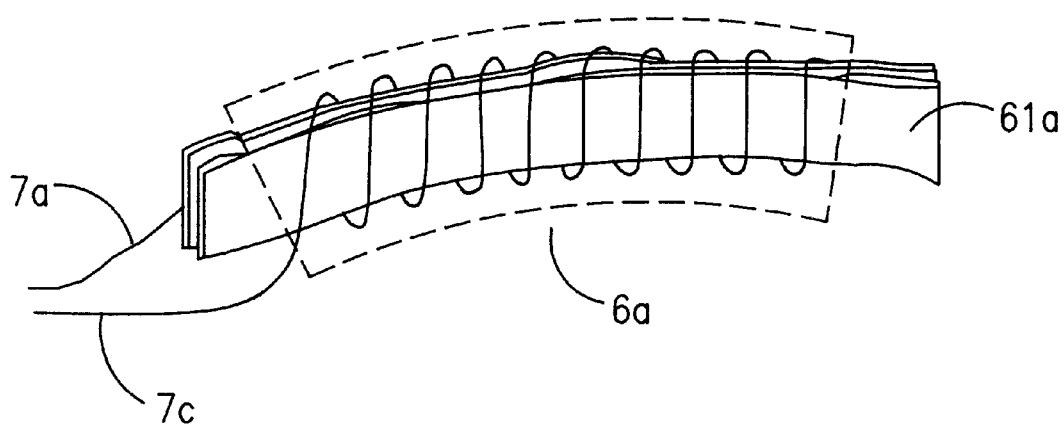
Figure 9B:
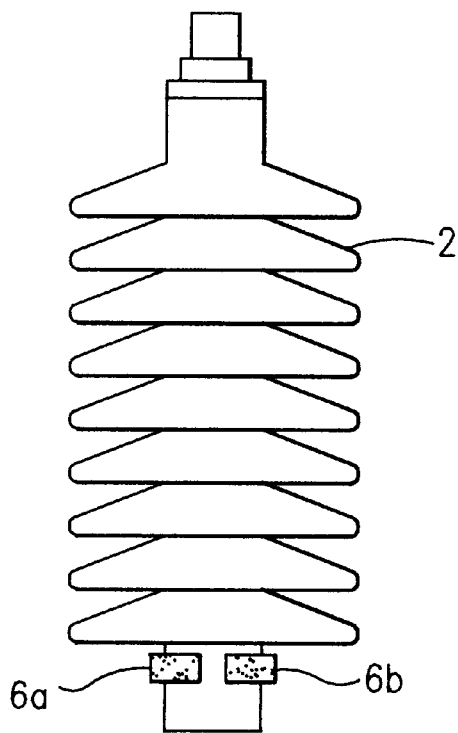
Figure 9C:
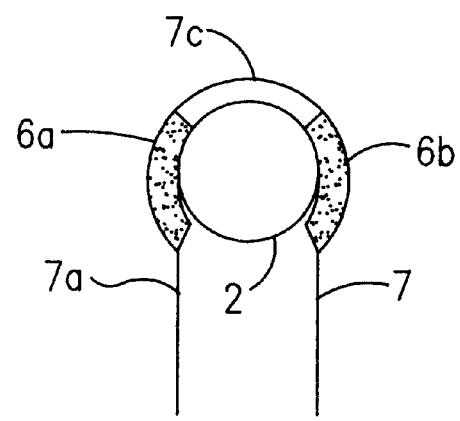

The inductive sensor is based on the principle of a Rogowski coil but has been modified to obtain sufficient sensitivity and to facilitate installation and manufacture. The inductive sensor thus comprises (FIGS. 9a, 9b, 9c) two relatively short coils 6a, 6b, which are mutually seriesconnected by means of a conductor 7c. Each one of the coils, of which FIG. 9a shows one, is wound onto a magnetic core 61a, 61b and the two coils are then connected in series with each other. FIG. 9a shows a design of the coils and FIGS. 9b and 9c show a preferred location thereof. To suppress disturbances, the two coils are mounted on the high-voltage bushing opposite to each other and are attached thereto, for example by gluing.

As a capacitive sensor, the capacitive test tap of the high-voltage bushing is used.

Figure 10:
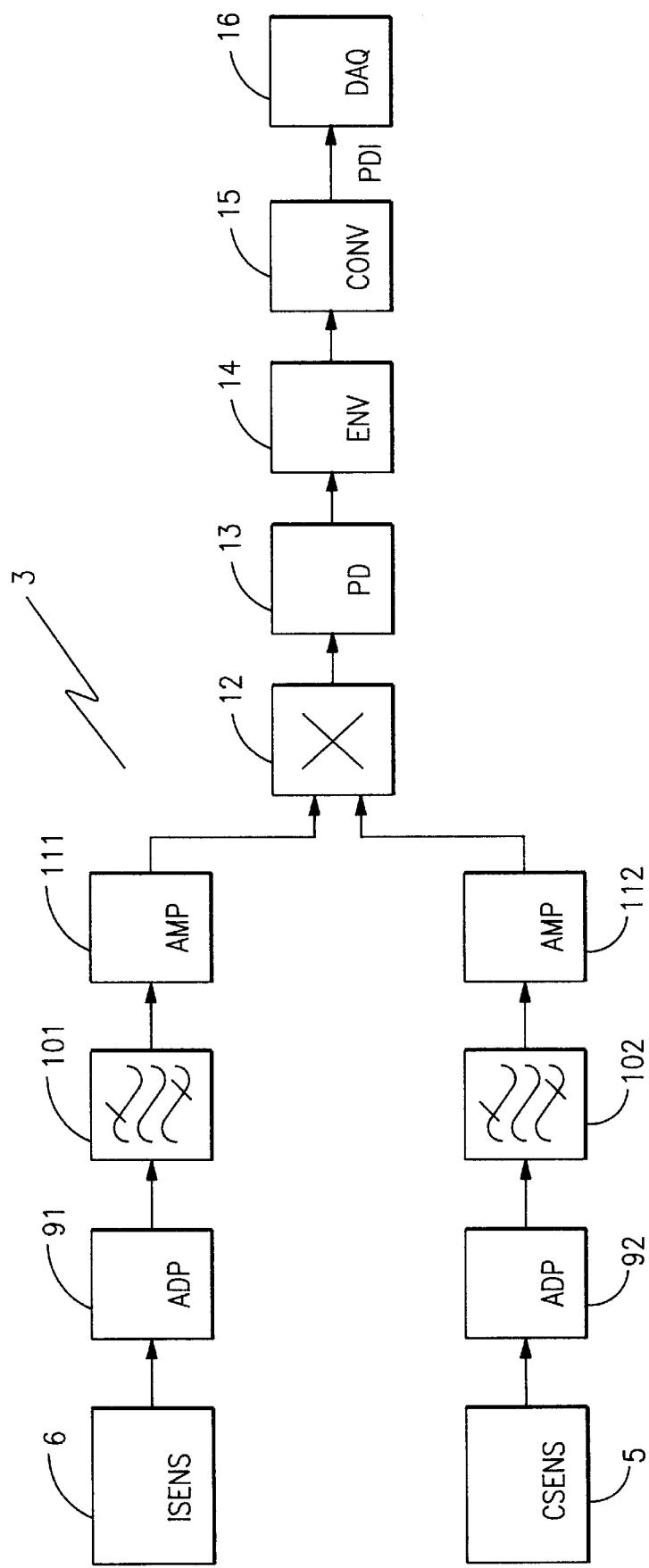
FIG. 10 shows in the form of a block diagram a signal matching unit according to the present invention.

The signal matching unit shown in FIG. 10 is supplied with signals from respectively the inductive sensor 6 and from the capacitive test tap 5. The signal matching unit comprises two matching circuits 91, 92 for matching of the respective signals to each other's level and for amplification to a suitable signal level. The matching is performed by means of passive circuit elements with resistive, inductive, and capacitive impedances. Each of the output signals from the respective matching circuits is then supplied to a different bandpass filter 101, 102. The bandpass filters are tuned to the resonance frequency of the coils. The resonance frequency of the coils has been chosen to attain the best signal/noise ratio.

The output signals from the respective bandpass filter are each supplied to an amplification means 111, 112, and the output signals therefrom are supplied to a multiplying means 12, in which the two signals are multiplied by each other. The output signal from the multiplier is now either positive or negative, depending on the origin of the discharge.

The measurement principle is based on determining the polarity of a partial discharge with the aid of the output signal from the capacitive test tap whereas the direction of the current pulse associated with the discharge is determined with the aid of the output signal from the inductive sensor. Thus, by sensing the electric as well as the magnetic field generated by the partial discharge, the direction of the power flux of the discharge may be determined, and the output signal from the multiplying means is either positive or negative depending on where the discharge is generated. Discharges outside the transformer will correspond to positive signals, or vice versa, depending on how the coils in the inductive sensor are wound. The boundary line for this polarity reversal is the location on which the coils are applied, usually at the base of the bushing. The output signals from the multiplying means are supplied to a peak value detector 13, which only forwards positive signals. The output signal from the peak value detector is then supplied to an envelope circuit 14, which extends the decay time for its input signal. The amplitude of the output signal from the envelope circuit is related to the level of the internal discharge such that an increasing level of internal discharge results in an increasing value of the output signal of the envelope circuit. This output signal is supplied to a data acquisition system 16, arranged outside the signal matching unit, via a conversion circuit 15 which converts the output signal from the envelope circuit to a corresponding direct current PDI. The direct current PDI from the signal matching unit to the data acquisition system will thus correspond to t he amount of internal discharge. The direct current is compared in the data acquisition unit with a preselected alarm level, programmed into the data acquisition unit. An alarm is considered to be an indication of a abnormal state in the power transformer and that a more careful investigation should be made. Further investigations may, for example, be made with some of the diagnostic tools which are available. See, for example, Proceedings of the 1995 Stockholm Power Tech Conference. C. Bengtsson: "Status and trends in Transformer Monitoring", for an overview.

The sensor system described may also improve, for example, PRPDA diagnostic measurements. The described direction-sensitive two-sensor system for sensing partial discharges has, during laboratory tests, shown a good capacity to distinguish internal discharges from external ones. This has also been verified during a field measurement carried out on a 100 MVA transformer.

FIGS. 2–4 and 5–8 show typical signal shapes for output signals from the signal matching unit with the time t plotted on the horizontal axis and the amplitude PDI of the output signal on the vertical axis.

Figure 2:
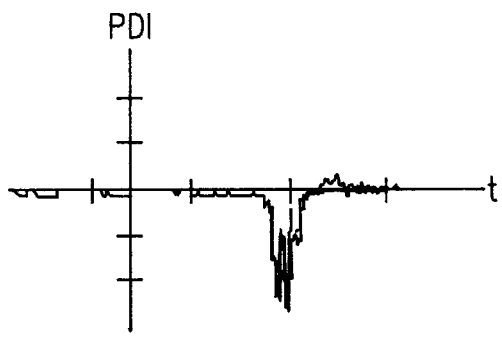
FIGS. 2–4 show signal shapes for output signals from a device according to the present invention.
Figure 3:
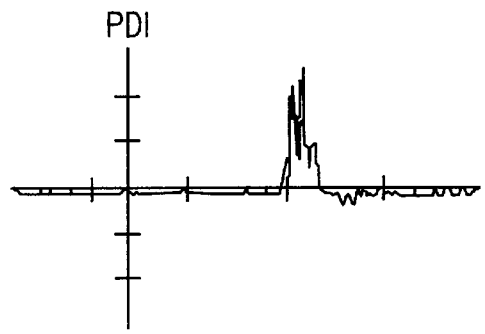

FIGS. 2–3 show signal shapes observed in a test room environment with the sensors applied to a separate high-voltage bushing provided with a capacitive test tap. The discharges were simulated by supplying both positive and negative calibration pulses according to IEC Publication 270 to both sides of the bushing. FIG. 2 shows the output signal in case of an externally applied calibration pulse, and FIG. 3 shows the output signal in case of an internally applied calibration pulse. As will be clear from the figures, the system can clearly distinguish internal discharges from external ones in that external discharges result in a negative output signal and an internal discharge results in a positive output signal.

This sign convention also applies to FIGS. 4 and 5–8.

Figure 4:
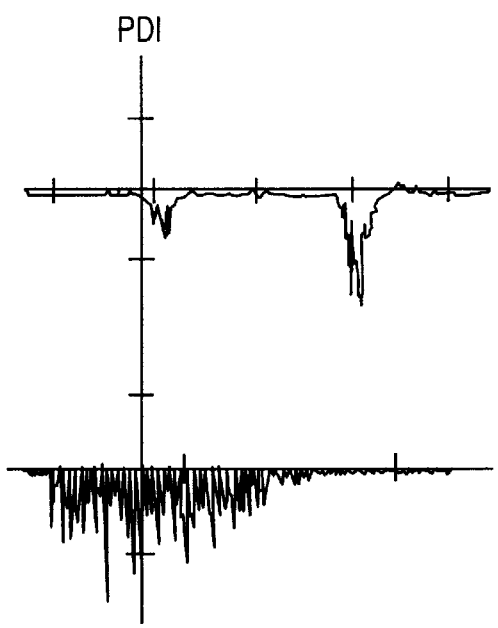

FIG. 4 shows signal shapes observed with the sensors applied to a laboratory transformer. External disturbances are simulated by means of a point plane gap connected to a high-voltage level and the figure shows an external disturbance (corona) both for half a period (lower horizontal axis) and with a higher resolution with respect to time (upper horizontal axis).

FIGS. 5–8 show signal shapes observed in the field with the sensors applied to a 130/50 kV 100 MVA transformer provided with capacitive test taps on the high-voltage bushings. The transformer had not previously shown any indication of partial discharges.

Figure 5:
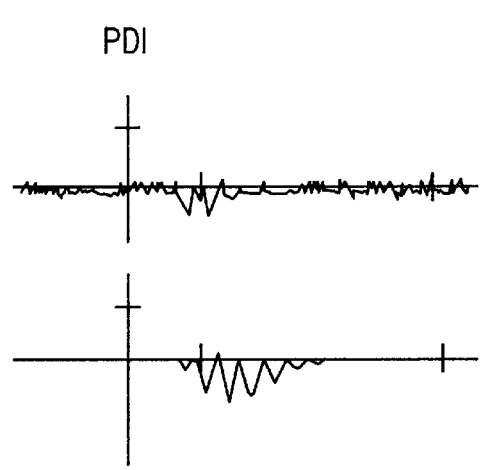
FIGS. 5–8 show further signal shapes for output signals from a device according to the present invention, FIG. 9a schematically shows part of an inductive sensor according to the invention, FIG. 9b schematically shows a side view of a high-voltage bushing with a location of the inductive sensors according to the invention, FIG. 9c schematically shows an end view of a high-voltage bushing according to FIG. 9b.

FIG. 5 shows signal shapes observed with the sensors applied to phase 1 and phase 2 and with an external calibration pulse applied to phase 2. As is clear from the figure, an output signal with a negative polarity (lower horizontal axis) is observed. Because of the capacitive coupling between the phases, the calibration pulse results in an output signal also in phase 1 (upper horizontal axis).

Figure 6:
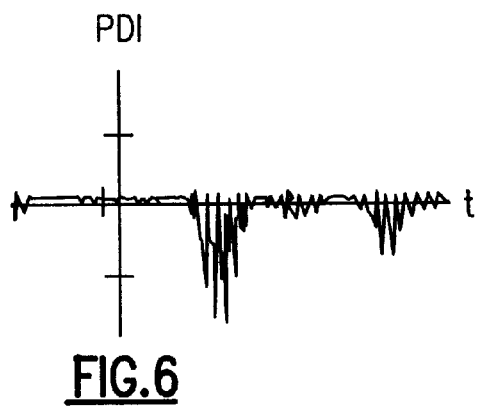
Figure 7:
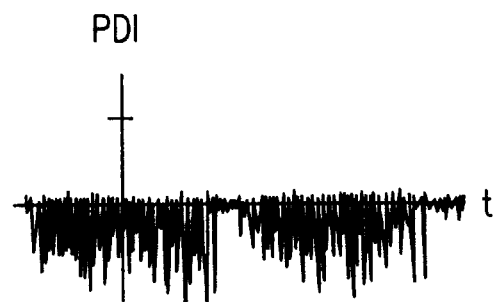
Figure 7:
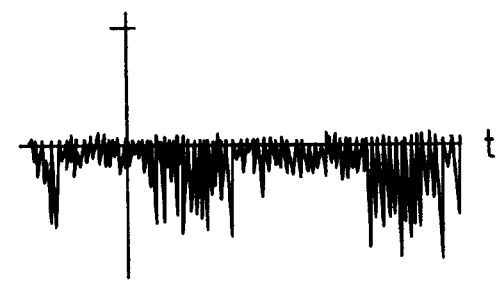
Figure 8:
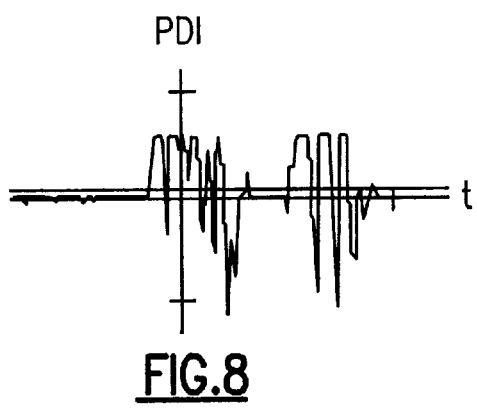

FIGS. 6–8 show signal shapes observed with the transformer connected to a 130 kV line and with the 50 kV side open.

FIG. 6 shows, with a high resolution with respect to time, typical signal shapes observed in phase 2 with a number of discharges.

FIG. 7 shows typical signal shapes observed over a full period, in phase 2 (upper horizontal axis) and phase 1 (lower horizontal axis).

For both phases, the discharge profile is quite similar and only negative signals are detected. This indicates that no internal discharges occur and it may be assumed that the observed output signals are caused by external disturbances (mainly corona) from connections and the connected switchgear.

An acoustic measurement of partial discharges PD was performed parallel to the electric measurement. No acoustic signals indicating internal defects were observed.

FIG. 8 shows typical signal shapes observed during operation of the tap changer of the transformer. The positive parts of the output signal indicate internal transients. The signals caused by the tap-changer operation are larger, by several orders of magnitude, than those signals from partial discharges which the device is to sense. For this reason, the amplifiers are saturated and an associated phase shift occurs. This is the reason for the negative values of the output signal in FIG. 8.

FIGS. 5–8 show that the system is able to distinguish between internal and external discharges also under field conditions.

The invention is not limited to the embodiments shown but a plurality of modifications, easily realized by one skilled in the art, are feasible within the scope of the inventive concept. Thus, the inductive sensor need not necessarily be designed in the form of two series-connected coils but may be designed as one single coil. As a capacitive sensor, the capacitive test taps of the high-voltage bushings of the transformer may preferably be used. However other sensors for sensing of the electric field associated with the partial discharge may be used.

The test results together with the simplicity, the low cost and the simplicity of installing the sensor system show that the invention is suitable for direct-connected monitoring of both new and existing power transformers.

We claim:

1. A method for monitoring partial discharges in an electric power transformer under normal operating conditions, comprising:

sensing a magnetic field at a high-voltage bushing on the power transformer with an inductive sensor that includes at least one coil arranged at the bushing;

sensing an electric field at the high-voltage bushing with a capacitive sensor;

supplying output signals from the inductive sensor and the capacitive sensor to a signal processing unit in which each output signal is filtered in a separate bandpass filter;

multiplying the filtered output signals by each other;

forming with the signal processing unit a PDI output signal corresponding to the amount of internal partial discharge in the transformer in dependence on the result of the multiplication to detect internal partial discharges in the transformer.

2. The method according to claim 1, wherein the capacitive sensor includes a capacitive test tap on the high-voltage bushing.

3. A device for monitoring partial discharges in an electric power transformer under normal operating conditions, comprising:

an inductive sensor including at least one coil arranged at a high-voltage bushing on the power transformer;

a capacitive sensor arranged at the bushing; and a signal processing unit for receiving output signals from the inductive sensor and the capacitive sensor and forming a PDI output signal corresponding to the corresponding to the amount of internal partial discharge in the transformer, the signal processing unit including bandpass filters for filtering the output signals from the inductive sensor and the capacitive sensor, the signal processing unit also including a multiplier for multiplying signals from the respective bandpass filter by each other and producing the PDI output signal in dependence on the output signal from the multiplier.

4. The device according to claim 3, wherein the inductive sensor includes two mutually series-connected coils arranged opposite to each other at the high-voltage bushing.

5. The device according to claim 3, wherein the capacitive sensor includes a capacitive test tap on the high-voltage bushing.

6. The device according to claim 3, wherein the signal matching unit includes a peak value detector for receiving a signal from the multiplier and for transmitting signals only with a preselected polarity.

7. The device according to claim 3, wherein the signal matching unit includes a conversion circuit for converting a signal from the multiplier into a direct current corresponding to the signal.

* * * * *